United States Patent
Hwu et al.

(10) Patent No.: US 9,748,379 B2
(45) Date of Patent: Aug. 29, 2017

(54) DOUBLE EXPONENTIAL MECHANISM CONTROLLED TRANSISTOR

(71) Applicants: Taiwan Semiconductor Manufacturing Co., Ltd., Hsin-Chu (TW); National Taiwan University, Taipei (TW)

(72) Inventors: Jenn-Gwo Hwu, Taipei (TW); Samuel C. Pan, Hsinchu (TW); Chien-Shun Liao, Taipei (TW)

(73) Assignees: Taiwan Semiconductor Manufacturing Co., Ltd., Hsin-Chu (TW); National Taiwan University, Taipei (TW)

( * ) Notice: Subject to any disclaimer, the term of this patent is extended or adjusted under 35 U.S.C. 154(b) by 0 days.

(21) Appl. No.: 14/836,054

(22) Filed: Aug. 26, 2015

(65) Prior Publication Data
US 2016/0380098 A1    Dec. 29, 2016

Related U.S. Application Data

(60) Provisional application No. 62/184,359, filed on Jun. 25, 2015.

(51) Int. Cl.
*H01L 29/78* (2006.01)
*H01L 29/66* (2006.01)
(Continued)

(52) U.S. Cl.
CPC ........ *H01L 29/7827* (2013.01); *H01L 21/283* (2013.01); *H01L 21/28176* (2013.01);
(Continued)

(58) Field of Classification Search
CPC ... H01L 29/785; H01L 29/7391; H01L 21/28; H01L 21/28176; H01L 21/283;
(Continued)

(56) References Cited

U.S. PATENT DOCUMENTS

| 2009/0184369 | A1* | 7/2009 | Zhu | B82Y 10/00 |
| | | | | 257/347 |
| 2011/0260233 | A1* | 10/2011 | Nguyen | H01L 21/823462 |
| | | | | 257/316 |

(Continued)

OTHER PUBLICATIONS

Ionescu, et al. "Tunnel field-effect transistors as energy-efficient electronic switches." Nature, vol. 479, Nov. 17, 2011.
(Continued)

*Primary Examiner* — Fazli Erdem
(74) *Attorney, Agent, or Firm* — Eschweiler & Potashnik, LLC

(57) ABSTRACT

The present disclosure relates to a tunnel FET device with a steep sub-threshold slope, and a corresponding method of formation. In some embodiments, the tunnel FET device has a dielectric layer arranged over a substrate. A conductive gate electrode and a conductive drain electrode are arranged over the dielectric layer. A conductive source electrode contacts the substrate at a first position located along a first side of the conductive gate electrode. The conductive drain electrode is arranged at a second position located along the first side of the conductive gate electrode. By arranging the conductive gate electrode over the dielectric layer at a position laterally offset from the conductive drain electrode, the conductive gate electrode is able to generate an electric field that controls tunneling of minority carriers, which can change the effective barrier height of the tunnel barrier, and thereby improving a sub-threshold slope of the tunnel FET device.

20 Claims, 10 Drawing Sheets

(51) Int. Cl.
*H01L 29/423* (2006.01)
*H01L 29/417* (2006.01)
*H01L 29/45* (2006.01)
*H01L 21/306* (2006.01)
*H01L 21/283* (2006.01)
*H01L 21/28* (2006.01)

(52) U.S. Cl.
CPC .. *H01L 21/30604* (2013.01); *H01L 29/41741* (2013.01); *H01L 29/41775* (2013.01); *H01L 29/42368* (2013.01); *H01L 29/42376* (2013.01); *H01L 29/45* (2013.01); *H01L 29/66666* (2013.01)

(58) Field of Classification Search
CPC ... H01L 21/30604; H01L 29/66; H01L 29/78; H01L 29/7827; H01L 29/41741; H01L 29/41775; H01L 29/42368; H01L 29/42376; H01L 29/45; H01L 29/66666
See application file for complete search history.

(56) References Cited

U.S. PATENT DOCUMENTS

| | | | |
|---|---|---|---|
| 2012/0032227 A1* | 2/2012 | Seabaugh | H01L 29/7391 257/105 |
| 2012/0187376 A1* | 7/2012 | Tomioka | B82Y 10/00 257/24 |
| 2013/0119395 A1* | 5/2013 | Bhuwalka | H01L 29/7391 257/76 |
| 2013/0320427 A1* | 12/2013 | Loh | H01L 29/7391 257/327 |
| 2014/0061777 A1* | 3/2014 | Kanemura | H01L 29/7827 257/329 |
| 2014/0138744 A1* | 5/2014 | Kotlyar | H01L 29/785 257/192 |
| 2014/0175381 A1* | 6/2014 | Goh | H01L 29/66545 257/39 |
| 2014/0264634 A1* | 9/2014 | Lee | H01L 29/7854 257/407 |
| 2015/0041847 A1* | 2/2015 | Kotlyar | H01L 29/785 257/105 |
| 2015/0171076 A1* | 6/2015 | Wernersson | B82Y 10/00 136/255 |
| 2015/0206958 A1* | 7/2015 | Walke | H01L 29/66356 257/105 |
| 2015/0228768 A1* | 8/2015 | Zhao | H01L 29/66977 257/39 |
| 2015/0340489 A1* | 11/2015 | Xiao | H01L 29/785 257/105 |
| 2016/0056278 A1* | 2/2016 | Avci | H01L 29/7391 257/12 |
| 2016/0079400 A1* | 3/2016 | Huang | H01L 29/7391 257/105 |
| 2016/0163840 A1* | 6/2016 | Lee | H01L 29/78609 257/105 |

OTHER PUBLICATIONS

Liao, et al. "Subthreshold Swing Reduction by Double Exponential Control Mechanism in an MOS Gated-MIS Tunnel Transistor." IEEE Transactions on Electron Devices, vol. 62, No. 6, Jun. 2015.
Lu, et al. "Tunnel Field-Effect Transistors: State-of-the-Art." Journal of the Electron Devices Society. May 23, 2014.
Morita, et al. "Performance Enhancement of Tunnel Field-Effect Transistors by Synthetic Electric Field Effect." IEEE Electron Device Letters, vol. 35, No. 7, Jul. 2014.
Luong, et al. "Strained Si Nanowire GAA n-TFETs for low supply voltages." Joint International EUROSOI Workshop and International Conference on Ultimate Integration on Silicon (EUROSOI-ULIS), 2015. Jan. 2015.

* cited by examiner

DOUBLE EXPONENTIAL MECHANISM CONTROLLED TRANSISTOR

REFERENCE TO RELATED APPLICATION

This application claims priority to U.S. Provisional Application No. 62/184,359 filed on Jun. 25, 2015, the contents of which are incorporated by reference in their entirety.

BACKGROUND

Field effect transistors (FETs) are widely used in integrated chips. FETs comprise a source region, a drain region, and a gate electrode. By applying a bias voltage to the gate electrode, current flow between the source region and the drain region can be controlled. The sub-threshold drain current of a FET is the current that flows between the source region and the drain region of a FET when the transistor is in a sub-threshold region (i.e., for gate-to-source voltages below the threshold voltage). A large sub-threshold slope (i.e., a small sub-threshold swing) is typically desired since it improves the ratio between on and off currents, and therefore reduces leakage currents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
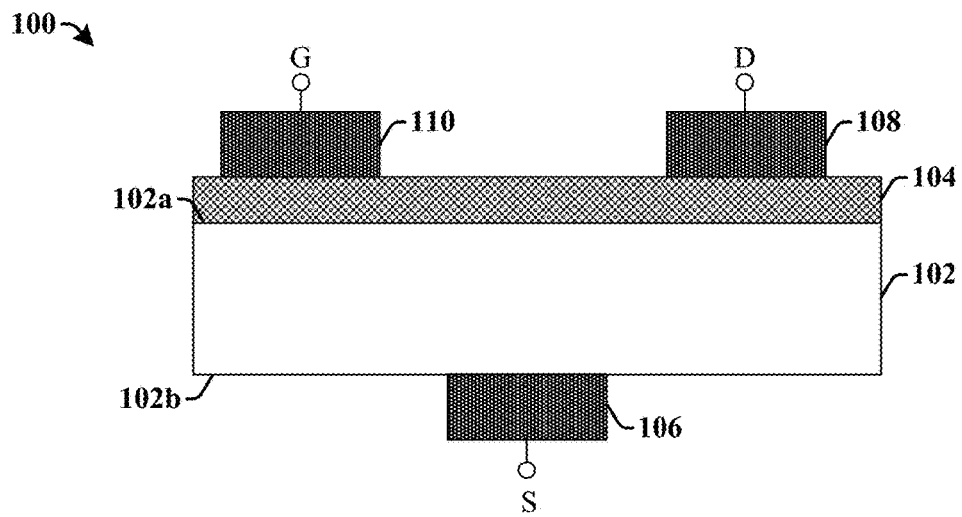
FIG. 1 illustrates some embodiments of a disclosed tunnel field effect transistor (TFET) device having a steep sub-threshold slope.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Downscaling of CMOS technology is currently facing challenges due to the non-scalability of the sub-threshold slope (SS) of metal-oxide-semiconductor field effect transistor (MOSFET) devices. A device characterized by steep sub-threshold slope exhibits a fast transition between off and on states and a scalable supply voltage. However, traditional MOSFET devices are limited in their sub-threshold slope due to a temperature dependence. For example, in a classical FET the sub-threshold swing cannot be reduced below a thermal limit of about 60 mV/decade at room temperature.

Tunnel FETs (TFETs) are transistor devices in which switching is induced by quantum-mechanical tunneling through a dielectric layer. Since TFETs allow the thermal limit of sub-threshold swing to be surpassed, TFETs have emerged as a potential alternative to traditional MOSFET transistors. TFETs have a low sub-threshold swing that is temperature independent, thereby allowing for high switching speeds and supply voltage scaling. While TFETs have a temperature independent sub-threshold slope, TFETs face fundamental limits to drive current due to low tunneling rates (e.g., less than 30%). Furthermore, attempts to improve the tunneling rates (e.g., formation of heterojunctions) use complex manufacturing processes that are costly to implement and unpractical for large scale production.

The present disclosure relates to a tunnel FET device with a steep sub-threshold slope, and a corresponding method of formation. In some embodiments, the tunnel FET device comprises a dielectric layer arranged over a substrate. A conductive gate electrode and a conductive drain electrode are arranged over the dielectric layer. A conductive source electrode contacts the substrate at a first position located along a first side of the conductive gate electrode. The conductive drain electrode is arranged at a second position located along the first side of the conductive gate electrode. By arranging the conductive gate electrode over the dielectric layer at a position laterally offset from the conductive drain electrode and the first position in which the conductive source electrode contacts the substrate, the conductive gate electrode is able to generate an electric field that controls tunneling of majority carriers within the dielectric layer and that also controls the diffusion of minority carrier within the substrate from under the conductive drain electrode to a location underlying the conductive drain electrode. The minority carriers can change the effective barrier height of a tunnel barrier, so that the conductive gate electrode controls a tunnel current by two different mechanisms (e.g., minority charge carrier diffusion and tunneling of majority charge carriers) and thereby allows the TFET device 100 to achieve a steep sub-threshold slope (e.g., of below 60 mV/decade).

FIG. 1 illustrates some embodiments of a disclosed tunnel field effect transistor (TFET) device 100 having a steep sub-threshold slope.

The TFET device 100 comprises a substrate 102. In some embodiments, the substrate 102 may comprise a semiconductor material, such as silicon, having an n-type or a p-type doping. A conductive source electrode 106 is in contact with the substrate 102. The conductive source electrode 106 is configured to provide charge carriers to the substrate 102. A dielectric layer 104 is arranged onto a front-side 102a of the substrate 102. In some embodiments, the dielectric layer may comprise an oxide (e.g., $SiO_2$). The dielectric layer 104 vertically separates the substrate 102 from a conductive drain electrode 108. The dielectric layer 104 provides for a tunnel barrier between the substrate 102 and the conductive drain electrode 108.

A conductive gate electrode 110 is located on the dielectric layer 104 at a position laterally separated from the conductive drain electrode 108. The conductive drain electrode 108 is arranged along a same side of the conductive gate electrode 110 as the conductive source electrode 106. In some embodiments, the conductive drain electrode 108 is arranged at a first position located along a first side of the conductive gate electrode 110, while the conductive source electrode 106 contacts the substrate 102 at a second position located along the first side of the conductive gate electrode 110. In some embodiments, the conductive source electrode 106 may contact the substrate 102 along a back-side 102b of the substrate 102. In other embodiments, the conductive source electrode 106 may contact the substrate 102 along a front-side 102a of the substrate 102. In such embodiments, the conductive drain electrode 108 is arranged between the conductive source electrode 106 and the conductive gate electrode 110.

By arranging the conductive gate electrode 110 over the dielectric layer 104 at a position that laterally offset from the conductive drain electrode 108, the conductive gate electrode 110 is able to generate an electric field that controls tunneling of majority charge carriers (e.g., holes) through the dielectric layer 104 (i.e., from the conductive drain electrode 108 to the substrate 102) and that also controls the diffusion of minority carrier (e.g., electrons) within the substrate 102 from a location below the conductive gate electrode 110 to a location underlying the conductive drain electrode 108. The minority carriers can change (i.e., modulate) the effective barrier height of the dielectric layer 104, so that the conductive gate electrode 110 controls a tunnel current (i.e., a drain current) by two different mechanisms (e.g., minority charge carrier diffusion and tunneling of majority charge carriers) and thereby allows the TFET device 100 to achieve a steep sub-threshold slope (e.g., of below 60 mV/decade).

Figure 2A:
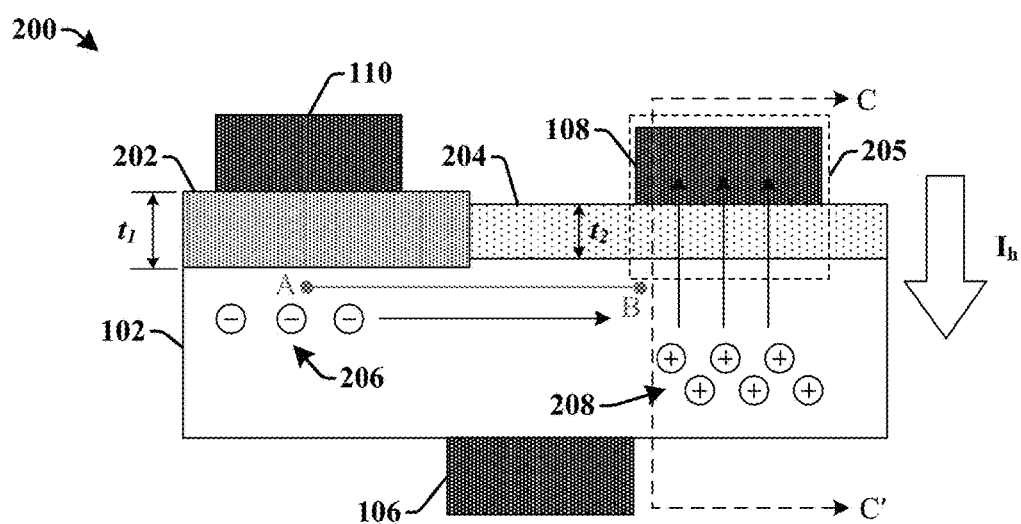
FIGS. 2A-5 illustrate some alternative embodiments of a disclosed TFET device.
Figure 2B:
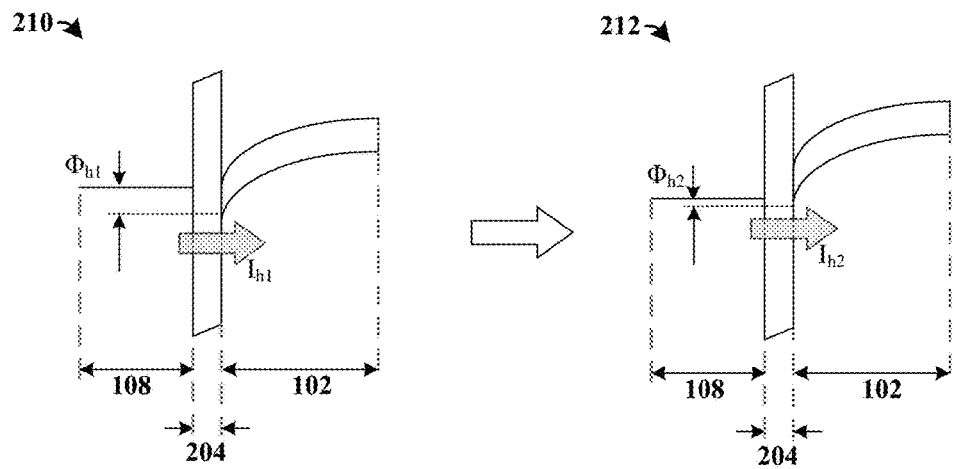

FIGS. 2A-2B illustrates some alternative embodiments of a disclosed TFET device 200.

As shown in FIG. 2A, the TFET device 200 comprises a gate dielectric layer 202 and a tunnel dielectric layer 204 arranged over a substrate 102. The gate dielectric layer 202 is arranged laterally adjacent to the tunnel dielectric layer 204. In some embodiments, the gate dielectric layer 202 may have a first thickness $t_1$, while the tunnel dielectric layer 204 may have a second thickness $t_2$ that is less than the first thickness $t_1$. The gate dielectric layer 202 is vertically arranged between the substrate 102 and a conductive gate electrode 110. The tunnel dielectric layer 204 is vertically arranged between the substrate 102 and a conductive drain electrode 108. In some embodiments, the gate dielectric layer 202 and the tunnel dielectric layer 204 may comprise oxides.

A conductive source electrode 106 is in contact with the substrate 102 and is configured to provide charge carriers to the substrate 102 in the presence of a bias. By providing charge carriers to the substrate 102, a tunnel diode structure 205 is formed in which charge carriers tunnel from the substrate 102 (a source region) to the conductive drain electrode 108 (a drain region). In some embodiments, the conductive source electrode 106 is located on an opposite side of the substrate 102 as the conductive gate electrode 110 and the conductive drain electrode 108. In other embodiments (not shown), the conductive source electrode 106 may be located on a same side of the substrate 102 as the conductive gate electrode 110 and the conductive drain electrode 108.

During operation, the conductive drain electrode 108 is configured to generate an electric field. The electric field causes majority charge carriers 208 (e.g., holes) to tunnel through the tunnel dielectric layer 204, between the conductive drain electrode 108 and the substrate 102 (e.g., so that the tunnel dielectric layer 204 can be regarded as a channel region), to generate a tunnel current $I_h$ (moving in the direction of hole flow). During operation, the conductive gate electrode 110 is configured to generate an electric field. The electric field causes minority charge carriers 206 (e.g., electrons) to diffuse within the substrate 102 from below the conductive gate electrode 110 to below the conductive drain electrode 108 (e.g., from point A to point B), and to adjust an effective barrier height of the tunnel dielectric layer 204.

For example, when a bias voltage is applied to the conductive gate electrode 110, the conductive gate electrode 110 generates an electric field below the conductive gate electrode 110. The electric field controls the diffusion of minority charge carriers 206 according to an exponential function. The diffusion of minority charge carriers 206 is exponentially proportional to the bias voltage applied to the conductive gate electrode 110 (i.e., the diffusion current density of minority carriers, $J_{n,diff} \propto \exp(q(V_G - V_{FB}))/\eta kT$, wherein $V_{FB}$ is the flat band voltage, k is the Boltzman constant, T is temperature, and $\eta$ is a constant). Therefore, by increasing a bias voltage applied to the conductive gate electrode 110, the diffusion of minority charge carriers 206 can be increased.

The effective barrier height $\Phi_h^*$ of the tunnel dielectric layer 204 is dependent upon the diffusion of minority charge carriers 206 (i.e., $\Phi_h^* = \Phi_h - B|J_{n,diff}|d_{ox}$, where B is a constant and $d_{ox}$ is the tunnel oxide thickness). Therefore, the change of the diffusion of minority charge carriers 206 causes the barrier height $\Phi_h$ to change to an effective barrier height $\Phi_h^*$ of the tunnel dielectric layer 204 within the tunnel diode structure 205. For example, the effective barrier height $\Phi_h^*$ can be decreased by increasing the diffusion of minority charge carriers 206 from under the conductive gate electrode 110 to the interface of the tunnel dielectric layer 204 and the substrate 102. Reducing the effective barrier height $\Phi_h^*$ causes tunneling through the tunnel dielectric layer 204 to increase, since the current within the tunnel diode structure 205 is exponentially dependent on the effective barrier height (i.e., $I_h \propto \exp(-q\Phi_h^*/kT)$). Accordingly, the tunnel current $I_h$ is a double exponential function, which is dependent upon an exponential of the gate voltage (due to minority carrier diffusion) and an exponential of the barrier height $\Phi_h^*$ (i.e., $I_h \propto K_1^* \exp(-q\Phi_h^*/KT) + K_2^* \exp((q(V_G - V_{FB}))/\eta kT)))$, that allows a sub-threshold slope of below 60 mV/decade to be obtained by the TFET device 200.

FIG. 2B illustrates band diagrams, 210 and 212, shown along cross-sectional line C-C' of FIG. 2A. As shown in band diagram 210, the tunnel dielectric layer 204 forms an energy barrier between the substrate 102 and the conductive drain electrode 108. When a first bias voltage V1 is applied to the conductive gate electrode 110, the tunnel dielectric layer 204 forms an energy barrier having a first barrier height $\Phi_{h1}$ between the substrate 102 and the conductive drain electrode 108. The tunneling current $\Phi_{h1}$ is a function of the first barrier height $\Phi_{h1}$ since majority carriers tunneling rate is dependent upon the barrier height.

As shown in band diagram 212, when a second bias voltage V2, larger than the first bias voltage V1, is applied to the conductive gate electrode 110, the tunnel dielectric layer 204 forms an energy barrier between the substrate 102 and the conductive drain electrode 108 having a second barrier height $\Phi_{h2}$. The second barrier height $\Phi_{h2}$ is smaller than the first barrier height $\Phi_{h1}$. This is because the larger second bias voltage V2 causes minority carriers to diffuse to below the tunnel dielectric layer 204, where the minority carriers lower the energy barrier.

Figure 3:
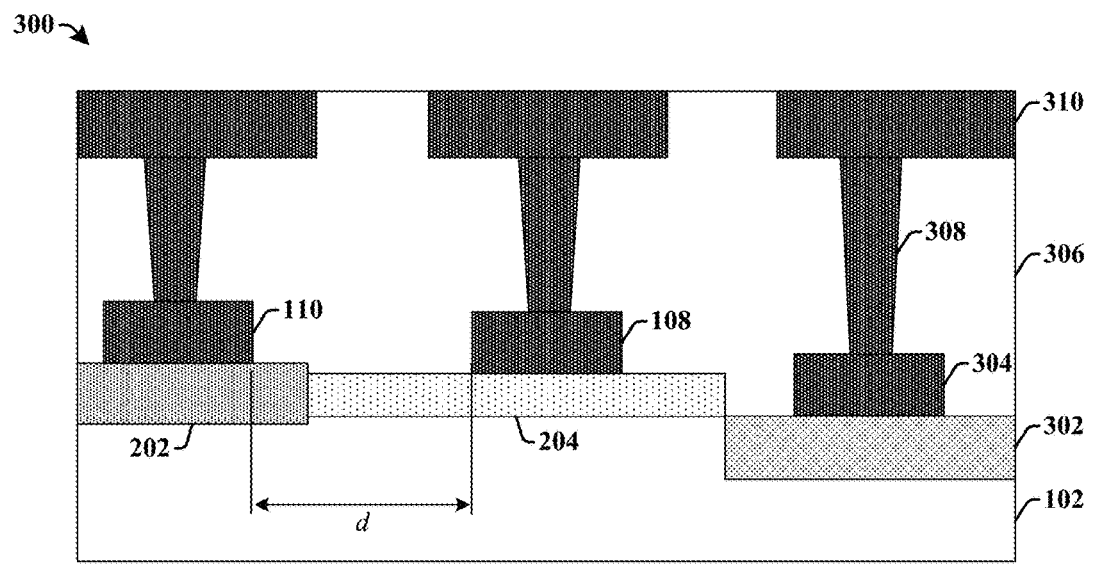

FIG. 3 illustrates some alternative embodiments of a disclosed TFET device 300.

The TFET device 300 comprises a conductive gate electrode 110 arranged over a gate dielectric layer 202 and a conductive drain electrode 108 arranged over the tunnel dielectric layer 204. The conductive drain electrode 108 is laterally separated from the conductive gate electrode 110 by a distance d. In some embodiments, the distance d is in a range of between approximately 5 mm and approximately 5 nm. In other embodiments, the distance d is in a range of between approximately 100 nm and approximately 10 nm.

A source contact region 302 is disposed within the substrate 102. The source contact region 302 is arranged in an upper surface of the substrate 102 at a location that is laterally adjacent to the tunnel dielectric layer 204, so that the tunnel dielectric layer 204 is laterally arranged between the source contact region 302 and the gate dielectric layer 202. The source contact region 302 comprises a higher doping concentration than the substrate 102. For example, in some embodiments, the source contact region 302 may have a doping concentration of greater than approximately 10E18 atoms/cm$^3$. A conductive source electrode 304 is arranged onto the source contact region 302. In various embodiments, the conductive drain electrode 108, the conductive gate electrode 110, and the conductive source electrode 304 may comprise a metal such as aluminum or gold, for example.

An inter-level dielectric (ILD) layer 306 is arranged over the substrate 102. Conductive contacts 308 vertically extend through the ILD layer 306 and electrically couple the conductive drain electrode 108, the conductive gate electrode 110, and the conductive source electrode 304 with an overlying metal interconnect layer 310.

Figure 4:
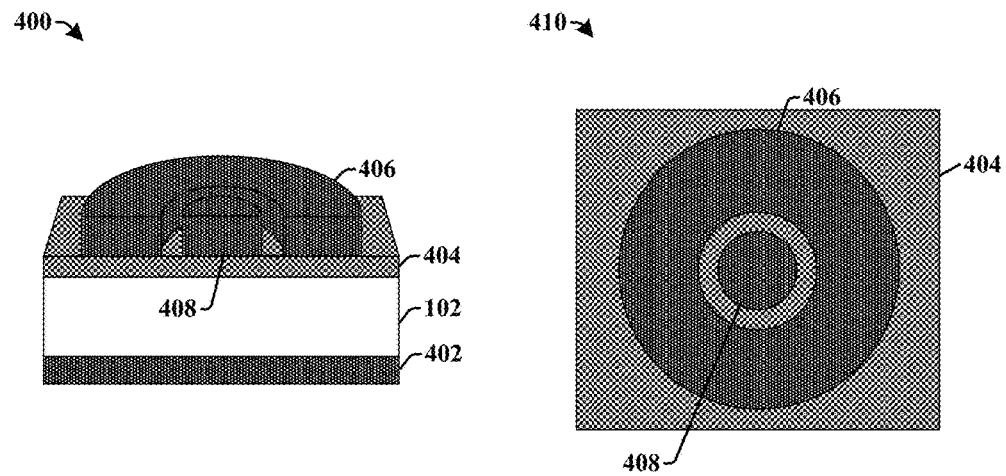

FIG. 4 illustrates a three-dimensional view of some alternative embodiments of a disclosed TFET device 400.

As shown in the three-dimensional view, the TFET device 400 comprises a conductive source electrode 402 in contact with a substrate 102. In some embodiments, the conductive source electrode 402 may be in contact with a lower surface of a substrate 102. In other embodiments (not shown), the conductive source electrode 402 may be arranged in contact with an upper surface of a substrate 102. A conductive gate electrode 406 and a conductive drain electrode 408 are arranged over a dielectric layer 404 disposed onto the substrate 102.

As shown in top-view 410, the conductive gate electrode 406 is an 'O' shaped contact that wraps around a periphery of the conductive drain electrode 408. Since the conductive gate electrode 406 extends around the conductive drain electrode 408, the conductive gate electrode 406 is able to provide for enhanced diffusion of minority carriers to the interface of the substrate 102 and the dielectric layer 404 from areas surrounding the conductive drain electrode 408.

Figure 5:
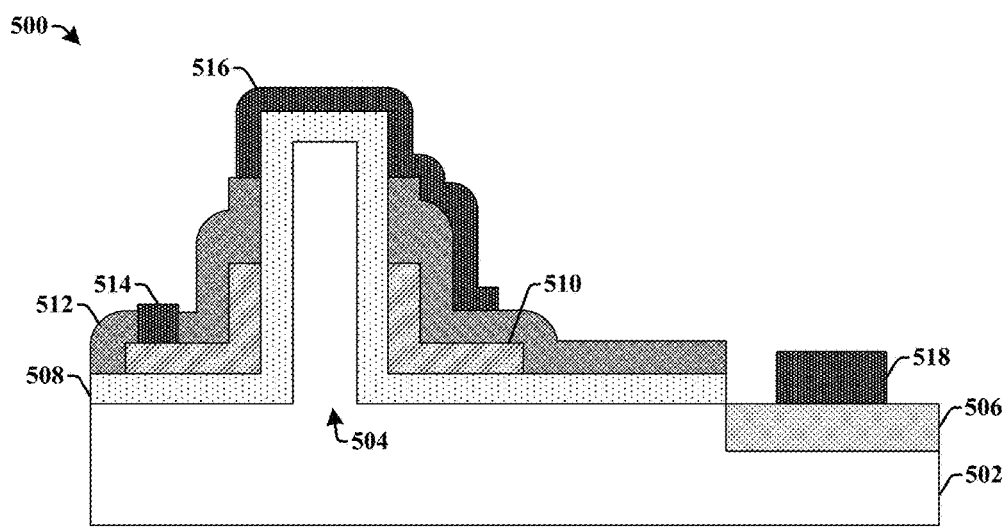

FIG. 5 illustrates some additional alternative embodiments of a disclosed TFET device 500.

The TFET device 500 comprises a fin of semiconductor material 504 protruding from an underlying semiconductor substrate 502. In some embodiments, the fin of semiconductor material 504 comprises the same material as the semiconductor substrate 502. A dielectric layer 508 is arranged over the semiconductor substrate 502. The dielectric layer 508 extends along a planar surface of the semiconductor substrate 502, and along sidewalls and an upper surface of the fin of semiconductor material 504. In some embodiments, the dielectric layer 508 may comprise a silicon dioxide (SiO$_2$) layer.

A metal gate layer 510 is arranged onto the dielectric layer 508. The metal gate layer 510 comprises 'L' shaped segments arranged on opposite sides of the fin of semiconductor material 504. The L shaped segments have a horizontal portion abutting a lateral surface of the dielectric layer 508 and a vertical portion abutting a sidewall of the dielectric layer 508. The vertical portion of the conductive metal layer 510 has an upper surface that is located below an upper surface of the fin of semiconductor material 504.

A conductive gate electrode 514 is arranged on the metal gate layer 510. A conductive source electrode 518 is arranged onto a source contact region 506 located within an upper surface of the semiconductor substrate 502. In some embodiments, the conductive gate electrode 514 is arranged along a first side of the fin of semiconductor material 504, while the conductive source electrode 518 is arranged along an opposite second side of the fin of semiconductor material 504.

A conductive drain electrode 516 is arranged onto the dielectric layer 508 at a location laterally between the conductive gate electrode 514 and the conductive source electrode 518. The conductive drain electrode 516 straddles the fin of semiconductor material 504. The conductive drain electrode is separated from the metal gate layer 510 by an isolation layer 512 arranged over the metal gate layer 510 and the dielectric layer 508. The isolation layer 512 comprises an electrically isolating material (e.g., a dielectric material) and is configured to provide electrical isolation between the metal gate layer 510 and the conductive drain electrode 516.

Figure 6:
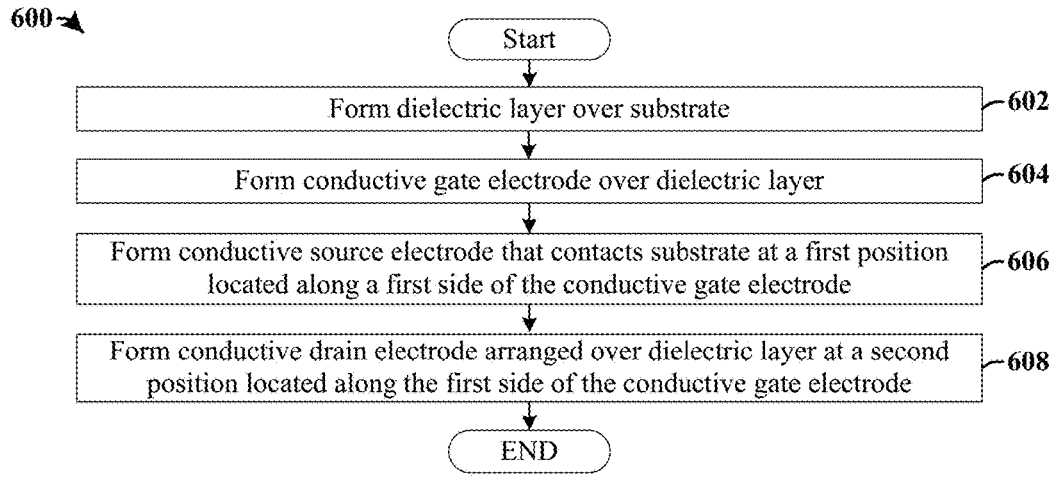
FIG. 6 illustrates some embodiments of a method of forming a disclosed TFET device.

FIG. 6 illustrates some embodiments of a method 600 of forming a disclosed TFET device.

While the disclosed methods (e.g., methods 600, 700, and/or 1500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a dielectric layer is formed over a substrate.

At 604, a conductive gate electrode is formed over the dielectric layer.

At 606, a conductive source electrode is formed. The conductive source electrode is in contact with the substrate at first position located along a first side of the conductive gate electrode, so that the substrate may operate as a source region during operation of the TFET device.

At 608, a conductive drain electrode is formed over the dielectric layer at a second position located along the first side of the conductive gate electrode.

Figure 7:
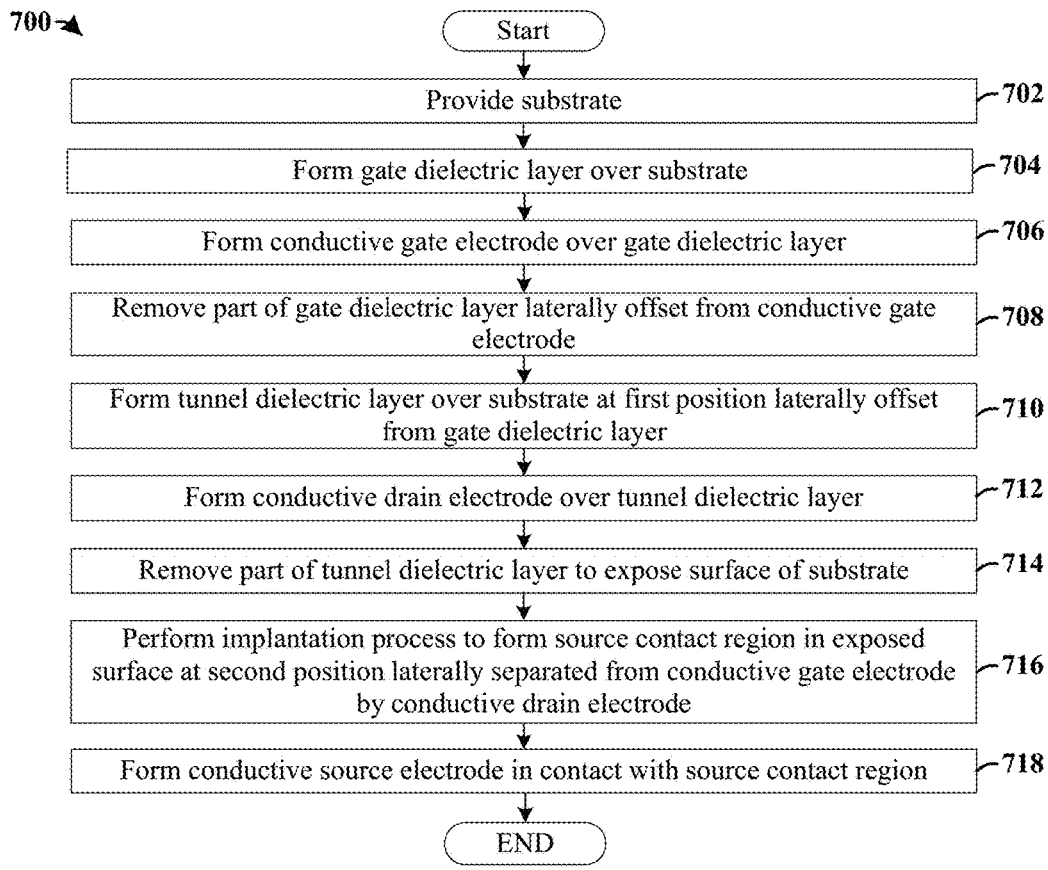
FIG. 7 illustrates some additional embodiments of a method of forming a disclosed TFET device.

FIG. 7 illustrates some additional embodiments of a method 700 of forming a disclosed TFET device.

At 702, a substrate is provided.

At 704, a gate dielectric layer is formed over a substrate.

At 706, a conductive gate electrode is formed over the gate dielectric layer.

At 708, a part of the gate dielectric layer, laterally offset from the conductive gate electrode, is removed.

At 710, a tunnel dielectric layer is formed over the substrate at a first position laterally offset from the gate dielectric layer.

At 712, a conductive drain electrode is formed over the tunnel dielectric layer.

At 714, a part of the tunnel oxide is removed to expose a surface of the substrate.

At 716, an implantation process is performed to form a source contact region in the exposed surfaces of the substrate at a second position laterally separated from the conductive gate electrode by the conductive drain electrode.

At 718, a conductive source electrode is formed in contact with the source contact region.

FIGS. 8-14 illustrate some embodiments of cross-sectional views showing a method of forming a disclosed TFET device. Although FIGS. 8-14 are described in relation to method 700, it will be appreciated that the structures disclosed in FIGS. 8-14 are not limited to such a method, but instead may stand alone as structures independent of the method.

Figure 8:
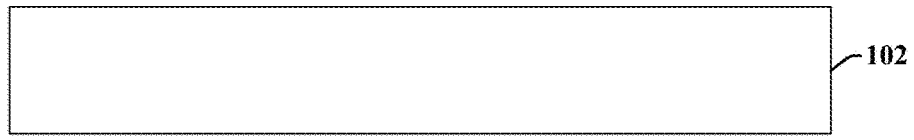
FIGS. 8-14 illustrate some embodiments of cross-sectional views showing a method of forming a disclosed TFET device.

FIG. 8 illustrates some embodiments of a cross-sectional view 800 of an integrated chip corresponding to act 702.

As shown in cross-sectional view 800, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

Figure 9:
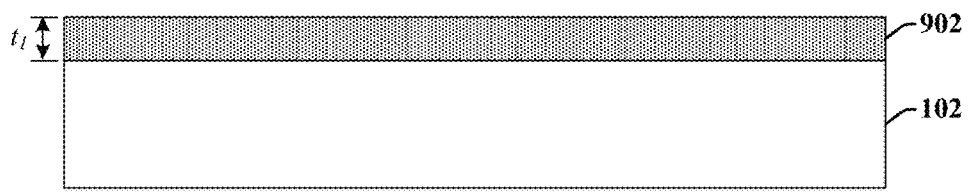

FIG. 9 illustrates some embodiments of a cross-sectional view 900 of an integrated chip corresponding to act 704.

As shown in cross-sectional view 900, a gate dielectric layer 902 is formed onto the substrate 102. In some embodiments, the gate dielectric layer 902 may comprise a silicon dioxide ($SiO_2$) layer having a first thickness $t_1$. In some embodiments, the gate dielectric layer 902 may be formed by way of a thermal oxidation process. In other embodiments, the gate dielectric layer 902 may be formed by way of a deposition process (e.g., CVD, PE-CVD, etc.).

Figure 10:
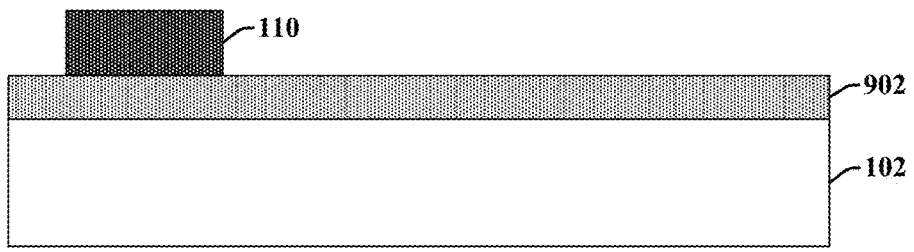

FIG. 10 illustrates some embodiments of a cross-sectional view 1000 of an integrated chip corresponding to act 706.

As shown in cross-sectional view 1000, a conductive gate electrode 110 is formed over the gate dielectric layer 902. In some embodiments, the conductive gate electrode 110 may be formed by depositing a conductive metal layer over the gate dielectric layer 902. The conductive metal layer is subsequently patterned to form the conductive gate electrode 110.

Figure 11:
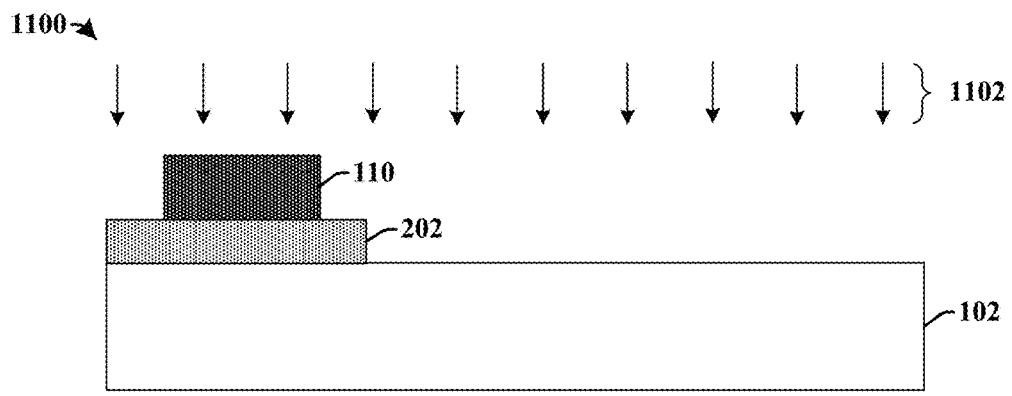

FIG. 11 illustrates some embodiments of a cross-sectional view 1100 of an integrated chip corresponding to act 708.

As shown in cross-sectional view 1100, the gate dielectric layer 202 is selectively exposed to a first etchant 1102. The first etchant 1102 is configured to remove a portion of the gate dielectric layer 202 laterally offset from the conductive gate electrode 110. The gate dielectric layer 202 remaining after exposure to the first etchant 1102 laterally extends past the edges of the conductive gate electrode 110. In some embodiments, a masking layer (not shown) may be formed over a part of the gate dielectric layer 202 prior to exposure to the first etchant 1102. In various embodiments, the first etchant 1102 may comprise a dry etchant have an etching chemistry comprising a fluorine species (e.g., $CF_4$, $CHF_3$, $C_4F_8$, etc.) or a wet etchant (e.g., hydroflouric acid (HF)).

Figure 12:
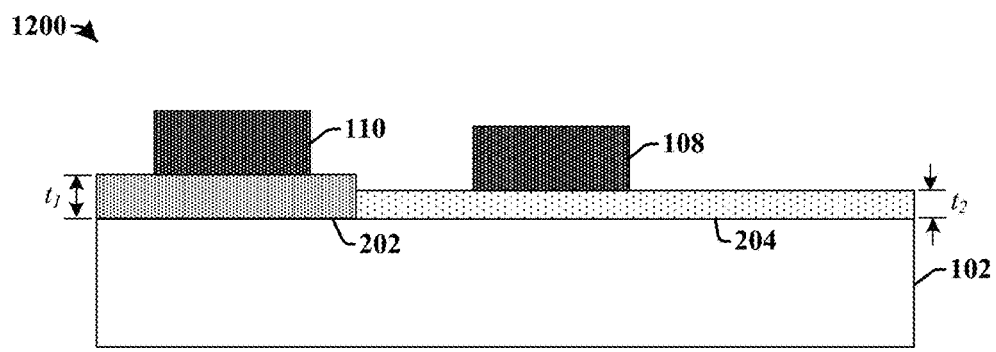

FIG. 12 illustrates some embodiments of a cross-sectional view 1200 of an integrated chip corresponding to acts 710-712.

As shown in cross-sectional view 1200, a tunnel dielectric layer 204 is formed onto the substrate 102 in regions not covered by the gate dielectric layer 202. The tunnel dielectric layer 204 laterally abuts the gate dielectric layer 202. In some embodiments, the tunnel dielectric layer 204 has a second thickness $t_2$ that is less than the first thickness $t_1$. In various embodiments, the tunnel dielectric layer 204 may be formed by way of a thermal oxidation process or by way of a deposition process (e.g., CVD, PE-CVD, etc.).

A conductive drain electrode 108 is formed over the gate dielectric layer 902. In some embodiments, the conductive drain electrode 108 may be formed by depositing a conductive metal layer over the tunnel dielectric layer 204. The conductive metal layer is subsequently patterned to form the conductive drain electrode 108.

Figure 13:
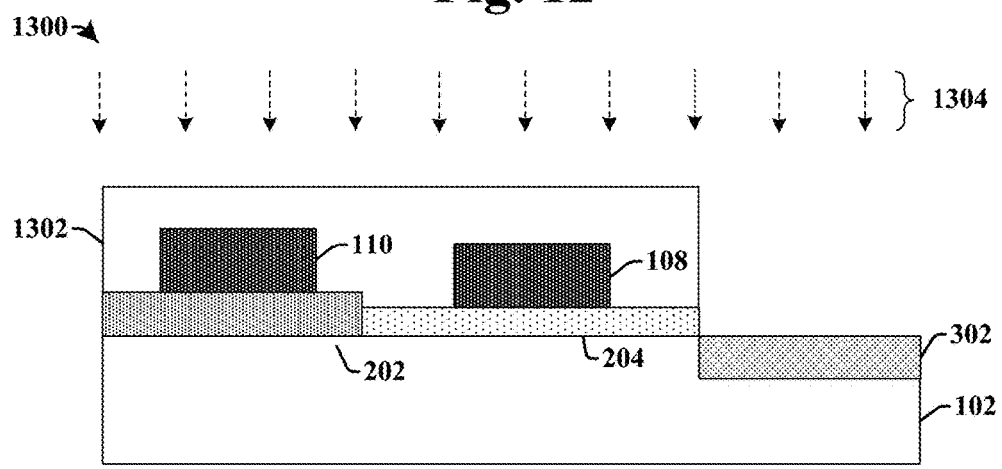

FIG. 13 illustrates some embodiments of a cross-sectional view 1300 of an integrated chip corresponding to act 714-716.

As shown in cross-sectional view 1300, the tunnel dielectric layer 204 is selectively exposed to a second etchant (not shown). The second etchant is configured to remove a portion of the tunnel dielectric layer 204 to expose the substrate 102 at a position laterally offset from the conductive drain electrode 108. The tunnel dielectric layer 204 remaining after exposure to the second etchant laterally extends past the edges of the conductive drain electrode 108. In some embodiments, a masking layer 1302 may be formed over the gate dielectric layer 202 and over the tunnel dielectric layer 204 prior to exposure to the second etchant. An implantation process 1304 is subsequently performed to implant a dopant species (e.g., boron, phosphorous, etc.) into the semiconductor substrate. In some embodiments, the dopant species may be implanted into areas of the substrate 102 not masked by the masking layer 1302. The implantation process 1304 forms a source contact region 302 within the substrate 102.

Figure 14:
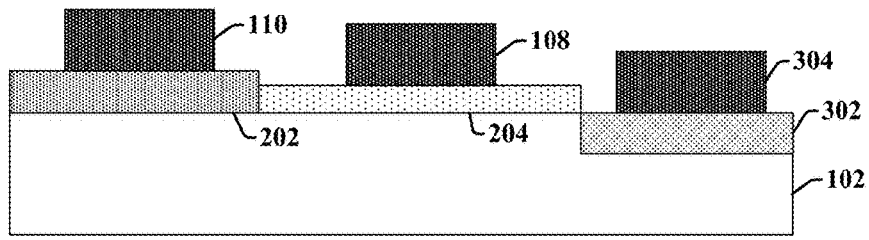

FIG. 14 illustrates some embodiments of a cross-sectional view 1400 of an integrated chip corresponding to act 718.

As shown in cross-sectional view 1400, a conductive source electrode 304 is formed over source contact region 302. In some embodiments, the conductive source electrode 304 may be formed by depositing a conductive metal layer over the source contact region 302. The conductive metal layer is subsequently patterned to form the conductive source electrode 304.

Figure 15:
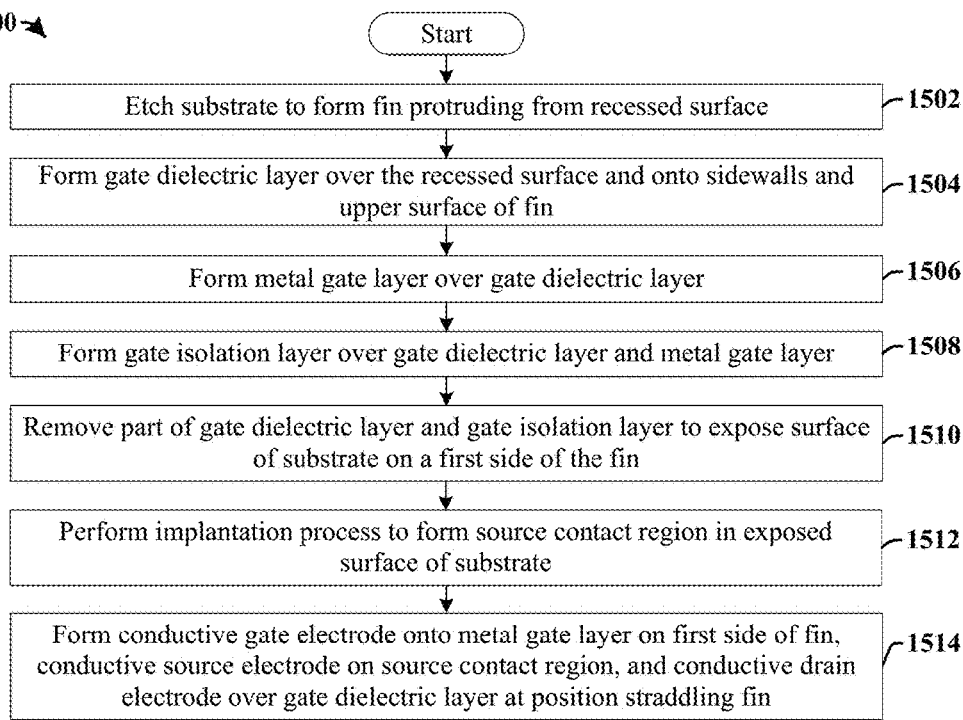
FIG. 15 illustrates some additional embodiments of a method of forming a disclosed TFET device.

FIG. 15 illustrates some additional embodiments of a method 1500 of forming a disclosed TFET device.

At 1502, a substrate is selectively etched to form a fin protruding from a recessed surface of a substrate.

At 1504, a dielectric layer is formed over the recessed surface of the substrate and onto sidewalls and an upper surface of the fin.

At 1506, a gate metal layer is formed over the dielectric layer.

At 1508, an isolation layer is formed over the dielectric layer and the gate metal layer.

At 1510, a part of the dielectric layer and the isolation layer is removed to form an exposed surface of the substrate on a first side of the fin.

At 1512, an implantation process is performed to form a source contact region within the exposed surface of the substrate.

At 1514, a conductive gate electrode is formed onto the gate metal layer on a second side of the fin, a conductive source electrode is formed onto the source contact region, and a conductive drain electrode over dielectric layer at position straddling the fin. The second side of the fin is opposite the first side of the fin, so that the conductive gate electrode is formed on an opposite side of the fin as the conductive source electrode.

FIGS. 16-20 illustrate some embodiments of cross-sectional views showing a method of forming a disclosed TFET device. Although FIGS. 16-20 are described in relation to method 1500, it will be appreciated that the structures disclosed in FIGS. 16-20 are not limited to such a method, but instead may stand alone as structures independent of the method.

Figure 16:
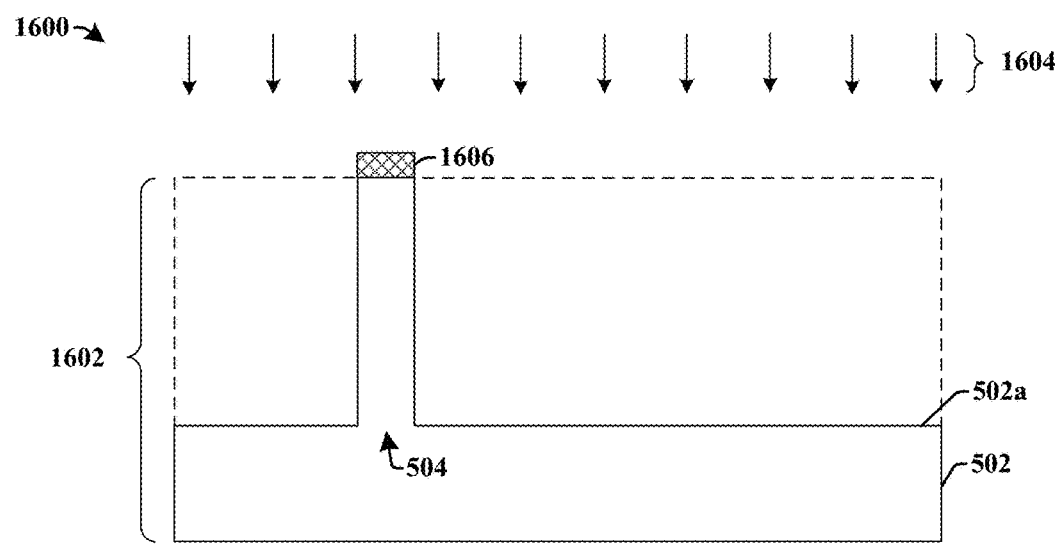
FIGS. 16-20 illustrate some embodiments of cross-sectional views showing a method of forming a disclosed TFET device.

FIG. 16 illustrates some embodiments of a cross-sectional view 1600 of an integrated chip corresponding to act 1502.

As shown in cross-sectional view 1600, a semiconductor substrate 1602 is selectively exposed to a first etchant 1604. The first etchant 1604 is configured to remove a portion of the semiconductor substrate 1602 so as to form a fin of semiconductor material 504 protruding outward from a recessed surface 502a of semiconductor substrate 502. In some embodiments, the semiconductor substrate 1602 may be selectively masked prior to exposure to the first etchant 1604 by a masking layer 1606 (e.g., a photoresist layer). In various embodiments, the first etchant 1604 may comprise a dry etchant have an etching chemistry comprising a fluorine species (e.g., $CF_4$, $CHF_3$, $C_4F_8$, etc.) or a wet etchant (e.g., hydroflouric acid (HF)).

Figure 17:
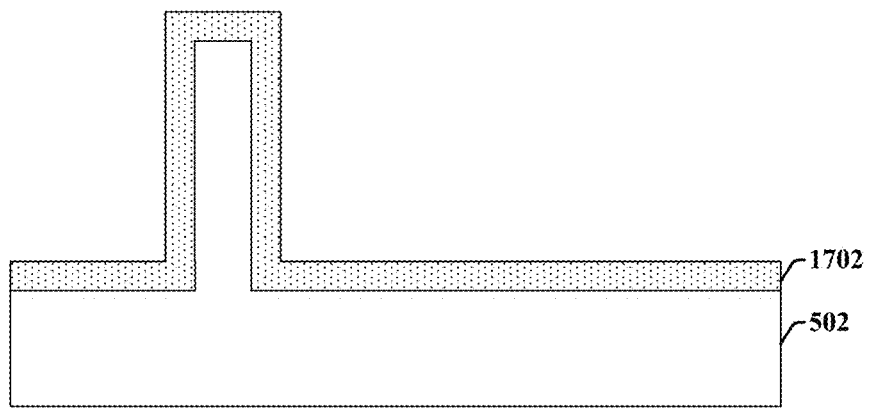

FIG. 17 illustrates some embodiments of a cross-sectional view 1700 of an integrated chip corresponding to act 1504.

As shown in cross-sectional view 1700, a dielectric layer 1702 is formed onto a semiconductor substrate 502. The dielectric layer 1702 extends along the recessed surface of the semiconductor substrate 502 and along sidewalls and an upper surface of the fin of semiconductor material 504. In some embodiments, the dielectric layer 1702 may comprise a silicon dioxide ($SiO_2$) layer. In some embodiments, the dielectric layer 1702 may be formed by way of a thermal oxidation process. In other embodiments, the dielectric layer 1702 may be formed by way of a deposition process (e.g., CVD, PE-CVD, etc.).

Figure 18:
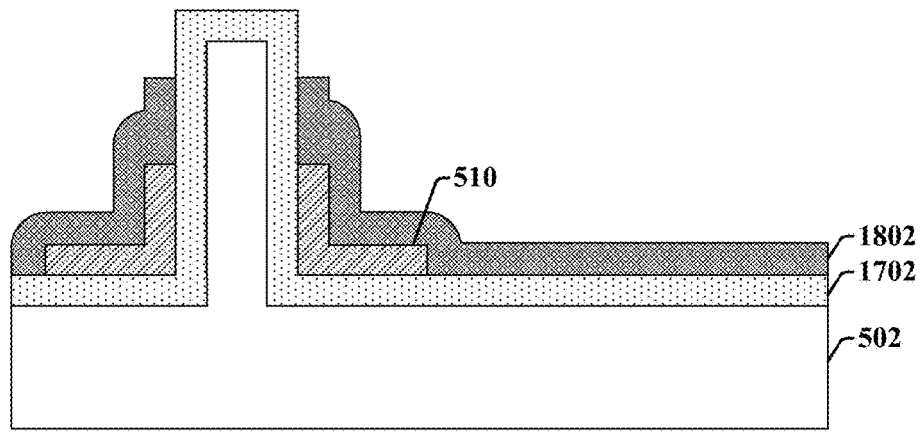

FIG. 18 illustrates some embodiments of a cross-sectional view 1800 of an integrated chip corresponding to acts 1506-1508.

As shown in cross-sectional view 1800, a metal gate layer 510 is formed onto the dielectric layer 1702. The metal gate layer 510 may be formed by depositing a conductive metal layer (e.g., aluminum, tungsten, gold, etc.) onto the dielectric layer 1702. The conductive metal layer may be formed using vapor deposition (e.g., chemical vapor deposition (CVD)) or any other suitable deposition technique. The conductive metal layer may be subsequently patterned so that the metal gate layer 510 comprises 'L' shaped segments on opposite sides of the fin of semiconductor material 504, which extend along a portion of the sidewalls of the fin of semiconductor material 504.

An isolation layer 1802 is formed over the metal gate layer 510. The isolation layer 1802 comprises an electrically insulating layer such as silicon dioxide, for example. The isolation layer 1802 may be formed to contact upper and sidewall surfaces of the dielectric layer 1702 and upper and sidewall surfaces of the metal gate layer 510. The isolation layer 1802 may be formed by depositing an electrically insulating layer onto the metal gate layer 510 and the dielectric layer 1702. The electrically insulating layer may be formed using vapor deposition (e.g., chemical vapor deposition (CVD)) or any other suitable deposition technique. The electrically insulating layer may be subsequently patterned so that the isolation layer 1802 extends along a portion of the sidewalls of the fin of semiconductor material 504 on opposite sides.

Figure 19:
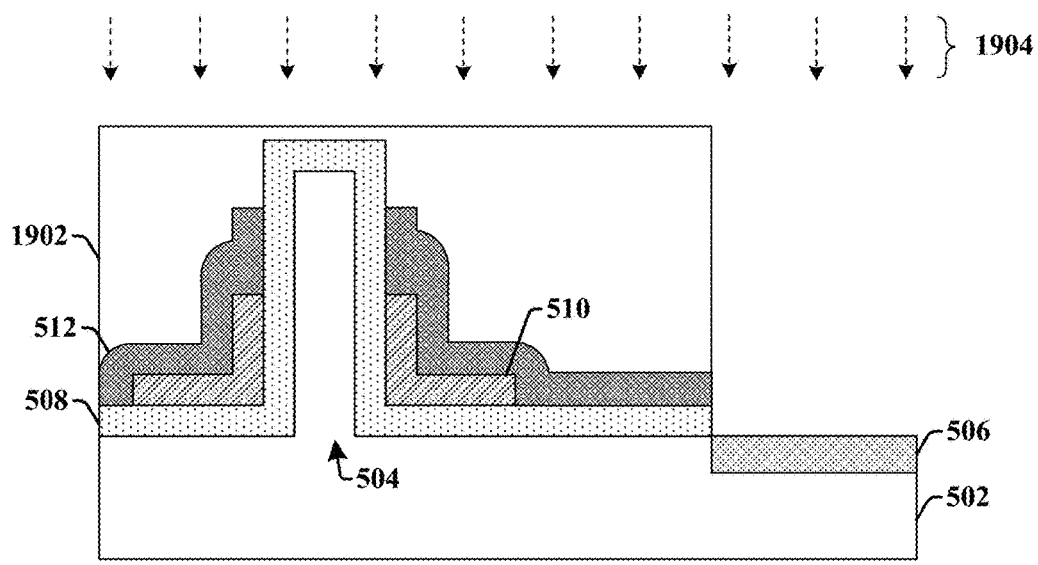

FIG. 19 illustrates some embodiments of a cross-sectional view 1900 of an integrated chip corresponding to acts 1510-1512.

As shown in cross-sectional view 1900, the isolation layer 1802 and the dielectric layer 1702 are selectively exposed to a second etchant (not shown). The second etchant removes portions of the isolation layer 1802 and the dielectric layer 1702 not masked by masking layer 1902. In various embodiments, the second etchant may comprise a dry etchant have an etching chemistry comprising a fluorine species (e.g., $CF_4$, $CHF_3$, $C_4F_8$, etc.) or a wet etchant (e.g., hydroflouric acid (HF)). An implantation process 1904 is subsequently performed to implant a dopant species (e.g., boron, phosphorous, etc.) into the semiconductor substrate. In some embodiments, the dopant species may be implanted into areas of the semiconductor substrate 502 not masked by the masking layer 1902. The implantation process 1904 forms a source contact region 506 within the semiconductor substrate 502.

Figure 20:
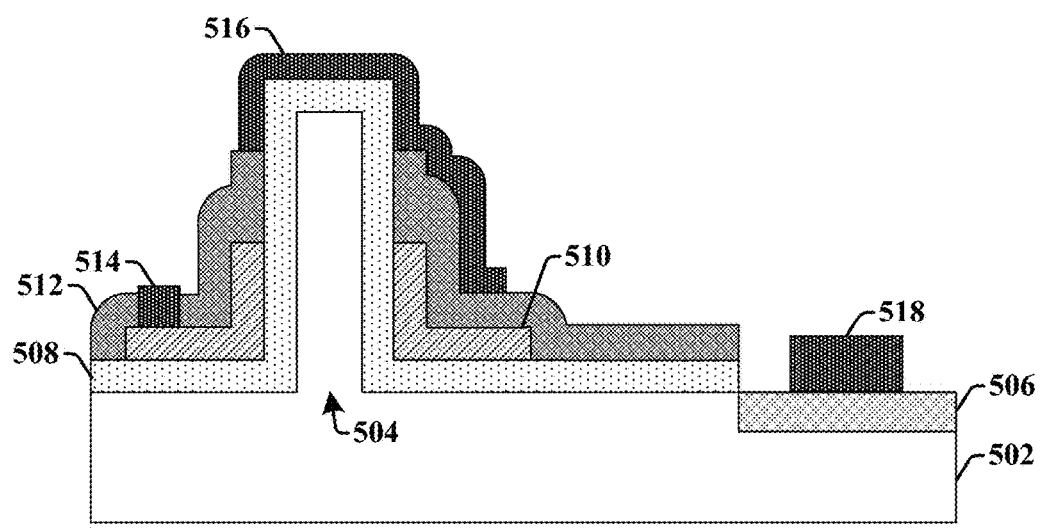

FIG. 20 illustrates some embodiments of a cross-sectional view 2000 of an integrated chip corresponding to act 1514.

As shown in cross-sectional view 2000, a conductive gate electrode 514, a conductive drain electrode 516, and a conductive source electrode 518 are formed over the semiconductor substrate 502. The conductive gate electrode 514 is formed onto a first side of the fin of semiconductor material 504. In some embodiments, an etching process may be performed to form an opening in the isolation layer 512 to expose the underlying metal gate layer 510 prior to forming the conductive gate electrode 514. The conductive source electrode 518 is formed onto the source contact region 506 on a second side of the fin of semiconductor material 504 opposite the first side. The conductive drain electrode 516 is formed over the dielectric layer 508 at position straddling the fin of semiconductor material 504. In some embodiments, the conductive gate electrode 514, the conductive drain electrode 516, and the conductive source electrode 518 are formed by depositing a conductive metal layer over the semiconductor substrate 502. The conductive metal layer is subsequently patterned to define the conductive gate electrode 514, the conductive drain electrode 516, and the conductive source electrode 518.

Therefore, the present disclosure relates to a tunnel field effect transistor (TFET) device that uses two exponential control mechanisms to achieve a steep sub-threshold slope, and a corresponding method of formation.

In some embodiments, the present disclosure relates to a tunnel field effect transistor (TFET) device. The TFET device comprises a dielectric layer arranged over a substrate. The TFET device further comprises a conductive gate electrode arranged over the dielectric layer, a conductive source electrode that contacts the substrate at a first position located along a first side of the conductive gate electrode, and a conductive drain electrode arranged over the dielectric layer at a second position located along the first side of the conductive gate electrode.

In other embodiments, the present disclosure relates to a tunnel field effect transistor (TFET) device. The TFET device comprises a semiconductor substrate. The TFET device further comprises a conductive gate electrode vertically separated from the semiconductor substrate by a gate dielectric layer disposed onto a front-side of the semiconductor substrate and having a first thickness. The TFET device further comprises a conductive source electrode in contact with the semiconductor substrate. The TFET device further comprises a conductive drain electrode vertically separated from the semiconductor substrate by a tunnel dielectric layer disposed onto the front-side of the semiconductor substrate and having a second thickness less than the first thickness, wherein the conductive drain electrode is laterally positioned along a same side of the conductive gate electrode as the conductive source electrode.

In yet other embodiments, the present disclosure relates to a method of forming a tunnel field effect transistor (TFET) device. The method comprises forming a dielectric layer over a substrate. The method further comprises forming a conductive gate electrode over the dielectric layer. The method further comprises forming a conductive source electrode that contacts the substrate at a first position located along a first side of the conductive gate electrode. The method further comprises forming a conductive drain electrode arranged over the dielectric layer at a second position located along the first side of the conductive gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tunnel field effect transistor (TFET) device, comprising:
a dielectric structure comprising one or more dielectric layers arranged over a substrate;
a conductive gate electrode contacting the dielectric structure;
a conductive source electrode that contacts the substrate at a first position located along a first side of the conductive gate electrode; and
a conductive drain electrode having a bottommost surface that faces the substrate and that directly contacts an upper surface of dielectric structure facing away from the substrate at a second position located along the first side of the conductive gate electrode.

2. The TFET device of claim 1, further comprising:
a gate dielectric layer having a first thickness vertically arranged between the conductive gate electrode and the substrate; and
a tunnel dielectric layer having a second thickness vertically arranged between the conductive drain electrode and the substrate, wherein the second thickness is less than the first thickness and wherein the tunnel dielectric layer has a first sidewall that contacts a second sidewall of the gate dielectric layer at a location between the conductive gate electrode and the conductive drain electrode.

3. The TFET device of claim 1, further comprising:
a source contact region arranged within the substrate at a location not underlying the dielectric structure, wherein the conductive source electrode is disposed onto an upper surface of the source contact region.

4. The TFET device of claim 1, wherein the conductive gate electrode comprises an 'o' shape having a curved sidewall that continuously wraps around a periphery of the conductive drain electrode.

5. The TFET device of claim 1, wherein the conductive drain electrode comprises aluminum.

6. The TFET device of claim 1, wherein the conductive drain electrode is separated from the conductive gate electrode by a distance in a range of between 100 nm and 10 nm.

7. The TFET device of claim 1, further comprising:
a fin comprising a same material as the substrate and protruding outward from the substrate; and
wherein the dielectric structure overlies the fin and the conductive drain electrode is arranged onto the dielectric structure and continuously extends from along a first sidewall of the fin to along an opposing second sidewall of the fin.

8. The TFET device of claim 7, wherein the conductive gate electrode is arranged on a first side of the fin and the conductive source electrode is arranged onto an opposite second side of the fin.

9. The TFET device of claim 1, wherein the conductive gate electrode is configured to generate an electric field that causes minority charge carriers to laterally diffuse from below the conductive gate electrode to below the conductive drain electrode.

10. A tunnel field effect transistor (TFET) device, comprising:
a semiconductor substrate;
a conductive gate electrode vertically separated from the semiconductor substrate by a gate dielectric layer disposed onto a front-side of the semiconductor substrate;
a conductive source electrode in electrical contact with the semiconductor substrate; and
a conductive drain electrode vertically separated from the semiconductor substrate by a tunnel dielectric layer disposed onto the front-side of the semiconductor substrate, wherein the conductive drain electrode is laterally positioned along a same side of the conductive gate electrode as the conductive source electrode and wherein the conductive drain electrode is configured to generate an electric field that causes majority charge carriers to tunnel through the tunnel dielectric layer at a location directly below the conductive drain electrode.

11. The TFET device of claim 10, wherein the conductive source electrode is in contact with the front-side of the semiconductor substrate.

12. The TFET device of claim 10, wherein the conductive source electrode is in contact with a back-side of the semiconductor substrate opposite the front-side of the semiconductor substrate.

13. The TFET device of claim 10,
wherein the conductive drain electrode is laterally between the conductive gate electrode and the conductive source electrode; and
wherein the conductive drain electrode is separated from the conductive source electrode and the conductive gate electrode by an inter-level dielectric (ILD) layer.

14. A method of forming a tunnel field effect transistor (TFET) device, comprising:
- forming a gate dielectric layer over a substrate;
- forming a conductive gate electrode over the gate dielectric layer, wherein the gate dielectric layer continuously extends along a line between a top surface contacting a lower surface of the conductive gate electrode and a bottom surface contacting the substrate;
- removing a part of the gate dielectric layer from a location laterally offset from the conductive gate electrode;
- forming a tunnel dielectric layer over the substrate at the location laterally offset from the conductive gate electrode after removing the part of the gate dielectric layer;
- forming a conductive source electrode that contacts the substrate at a first position located along a first side of the conductive gate electrode; and
- forming a conductive drain electrode over the tunnel dielectric layer.

15. The method of claim 14, further comprising:
- removing a part of the tunnel dielectric layer to form an exposed surface of the substrate; and
- forming the conductive source electrode in contact with the exposed surface of the substrate.

16. The TFET of claim 10, wherein the conductive gate electrode is configured to generate a second electric field that adjusts an effective barrier height of the tunnel dielectric layer.

17. The TFET of claim 10, wherein the conductive gate electrode is configured to generate a second electric field that causes minority charge carriers to move within the semiconductor substrate from below the conductive gate electrode to below the conductive drain electrode and to adjust an effective barrier height of the tunnel dielectric layer.

18. The TFET device of claim 1, wherein the dielectric structure continuously extends along a line between the bottommost surface of the conductive drain electrode and an upper surface of the substrate facing the bottommost surface of the conductive drain electrode.

19. The TFET device of claim 1,
- wherein the dielectric structure continuously extends from a first location directly contacting a bottommost surface of the conductive gate electrode facing the substrate to a second location directly contacting the bottommost surface of the conductive drain electrode; and
- wherein the dielectric structure has a topmost point at a greatest distance from the substrate that is below the bottommost surface of the conductive gate electrode facing the substrate.

20. The TFET device of claim 1,
- wherein the dielectric structure continuously extends from a first location directly contacting a bottommost surface of the conductive gate electrode facing the substrate to a second location directly contacting the bottommost surface of the conductive drain electrode; and
- wherein the dielectric structure continuously extends along a line between the bottommost surface of the conductive drain electrode to the substrate.

* * * * *